United States Patent
Yuan et al.

(10) Patent No.: US 11,875,750 B2
(45) Date of Patent: Jan. 16, 2024

(54) ARRAY SUBSTRATE AND MANUFACTURING METHOD THEREOF, DISPLAY PANEL AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Zhidong Yuan, Beijing (CN); Pan Xu, Beijing (CN); Can Yuan, Beijing (CN); Yongqian Li, Beijing (CN); Zhongyuan Wu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 25 days.

(21) Appl. No.: 17/635,471

(22) PCT Filed: Dec. 26, 2020

(86) PCT No.: PCT/CN2020/139716
§ 371 (c)(1),
(2) Date: Feb. 15, 2022

(87) PCT Pub. No.: WO2022/134113
PCT Pub. Date: Jun. 30, 2022

(65) Prior Publication Data
US 2022/0398982 A1 Dec. 15, 2022

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G11C 19/287* (2013.01);
(Continued)

(58) Field of Classification Search
CPC ............... G09G 3/3233; G09G 3/3266; G09G 2300/0426; G09G 2300/0819;
(Continued)

(56) References Cited

U.S. PATENT DOCUMENTS

2018/0047329 A1 2/2018 Shang et al.
2018/0293956 A1 10/2018 Yao
(Continued)

FOREIGN PATENT DOCUMENTS

CN 109272921 1/2019
CN 109459901 3/2019
(Continued)

OTHER PUBLICATIONS

PCT International Search Report (w/ English translation) and Written Opinion for corresponding PCT Application No. PCT/CN2020/139716, dated Jul. 7, 2021, 12 pages.

*Primary Examiner* — Stacy Khoo
(74) *Attorney, Agent, or Firm* — Dority & Manning, P.A.

(57) ABSTRACT

An array substrate includes: a substrate, at least one gate driving circuit and at least one clock signal line that are located on a same side of the substrate. The gate driving circuit includes a plurality of cascaded shift registers located in different rows, the plurality of shift registers are divided into at least two groups of shift registers, each group of shift registers includes at least one shift register, located in a same column. A gate driving circuit in the at least one gate driving circuit corresponds to at least one clock signal line. The clock signal line includes a main body transmission section configured to transmit a clock signal, and at least two branch transmission sections connected to the main body transmission section. Each branch transmission section is connected to a clock signal input terminal of each shift register in a respective group of shift registers.

19 Claims, 7 Drawing Sheets

(52) U.S. Cl.
CPC ............... *G09G 2300/0819* (2013.01); *G09G 2300/0852* (2013.01); *G09G 2310/0286* (2013.01); *G09G 2310/08* (2013.01)

(58) Field of Classification Search
CPC ... G09G 2300/0852; G09G 2310/0286; G09G 2310/08; G11C 19/28; G11C 19/287
See application file for complete search history.

(56) References Cited

U.S. PATENT DOCUMENTS

| | | |
|---|---|---|
| 2019/0019467 A1 | 1/2019 | Kim et al. |
| 2020/0098311 A1 | 3/2020 | Hsu et al. |

FOREIGN PATENT DOCUMENTS

| | | |
|---|---|---|
| CN | 111091792 | 5/2020 |
| CN | 111179812 | 5/2020 |
| CN | 111223449 | 6/2020 |
| CN | 111430415 | 7/2020 |
| CN | 111583882 | 8/2020 |
| CN | 111613182 | 9/2020 |
| CN | 111679479 | 9/2020 |
| KR | 20190079825 | 7/2019 |

ABSTRACT SUBSTRATE AND
MANUFACTURING METHOD THEREOF,
DISPLAY PANEL AND DISPLAY DEVICE

CROSS-REFERENCE TO RELATED APPLICATION

This application is a national phase entry under 35 USC 371 of International Patent Application No: PCT/CN2020/139716, filed on Dec. 26, 2020, which is incorporated herein by reference in its entirety.

TECHNICAL FIELD

The present disclosure relates to the field of display technologies, and in particular, to an array substrate and a manufacturing method thereof, a display panel, and a display device.

BACKGROUND

An array substrate in a display panel mainly includes a substrate and a circuit configuration located on the substrate. The circuit configuration includes, for example, at least one gate driving circuit. The gate driving circuit includes a plurality of shift registers in a one-to-one correspondence with a plurality of rows of sub-pixels. The plurality of shift registers may drive the plurality of rows of sub-pixels to emit light in sequence under control of a clock voltage signal.

SUMMARY

In an aspect, an array substrate is provided. The array substrate includes a substrate, at least one gate driving circuit, and at least one clock signal line. The substrate having a display area and a non-display area located on at least one side of the display area. The gate driving circuit includes a plurality of shift registers that are cascaded, and the plurality of shift registers are respectively located in different rows. The plurality of shift registers are divided into at least two groups of shift registers, each group of shift registers includes at least one shift register located in a same column. The clock signal line and the gate driving circuit are located on a same side of the substrate. A gate driving circuit in the at least one gate driving circuit corresponds to at least one clock signal line. The clock signal line includes: a main body transmission section, an orthographic projection of the main body transmission section on the substrate being located in the non-display area, and the main body transmission section being configured to transmit a clock signal; and at least two branch transmission sections connected to the main body transmission section, orthographic projections of the at least two branch transmission sections on the substrate being located in the display area, and each branch transmission section being connected to a clock signal input terminal of each shift register in a respective group of shift registers.

In some embodiments, the display area includes a plurality of rows of pixel regions and a plurality of rows of shift register regions that are in a one-to-one correspondence. A row of pixel region and a respective row of shift register region are arranged adjacently. Orthographic projections of the plurality of shift registers in the gate driving circuit on the substrate are in a one-to-one correspondence with and located in the plurality of rows of shift register regions.

In some embodiments; in two rows of shift register regions corresponding to two adjacent rows of pixel regions, each row of shift register region is located on a same side of a respective pixel region; or one row of shift register region is located on a first side, proximate to the one row of shift register region, of a respective pixel region, and another row of shift register region is located on a second side, proximate to the another row of shift register region, of a respective pixel region.

In some embodiments, the at least two groups of shift registers are a first group of shift registers to an M-th group of shift registers in sequence in a direction away from the main body transmission section. From the first group of shift registers to the M-th group of shift registers, a number of shift registers in each group of shift registers gradually decreases; and/or from the first group of shift registers to the M-th group of shift registers; any two adjacent groups of shift registers are not located in a same column.

In some embodiments, M is greater than or equal to 3. For any of the clock signal line(s), at least two branch transmission sections among all branch transmission sections connected to a second group of shift registers to the M-th group of shift registers include a common portion.

In some embodiments, the common portion is located on a side, proximate to the main body transmission section, of a group of shift registers closest to the main body transmission section in at least two groups of shift registers connected to the at least two branch transmission sections including the common portion.

In some embodiments, the branch transmission section includes a first portion connected to the main body transmission section and a second portion connected to the first portion. The second portion extends along a column direction in which a respective group of shift registers are arranged, and the respective group of shift registers are connected in parallel to the second portion.

In some embodiments, the first portion of the branch transmission section crosses no more than 100 pixels in a row direction.

In some embodiments, resistance-capacitance delays at ends of all branch transmission sections away from the main body transmission section are approximately equal.

In some embodiments, the at least two groups of shift registers include a first group of shift registers and a second group of shift registers that are sequentially away from the main body transmission section. The clock signal line includes a first branch transmission section and a second branch transmission section. The first branch transmission section includes at least a second portion extending along a column direction in which the first group of shift registers are arranged, and each shift register in the first group of shift registers is connected in parallel to the second portion of the first branch transmission section. The second branch transmission section includes a first portion and a second portion that are connected to each other. The first portion of the second branch transmission section is further connected to the main body transmission section, the second portion of the second branch transmission section extends along the column direction in which the second group of shift registers are arranged, and each shift register in the second group of shift registers is connected in parallel to the second portion of the second branch transmission section.

In some embodiments, orthographic projections of the plurality of shift registers on the substrate are respectively located in N rows of shift register regions, orthographic projections of the first group of shift registers on the substrate are located in X rows of shift register regions, and orthographic projections of the second group of shift registers on the substrate are located in (N−X) rows of shift register regions. The second portion of the first branch transmission section passes through the X rows of shift register regions. The first portion of the second branch transmission section passes through the X rows of shift register regions, and the second portion of the second branch transmission section passes through the (N−X) rows of shift register regions. X and N satisfy that:

$$X \cdot C1 = (N-X) \cdot C1 + X \cdot C2;$$

where X and N are both positive integers, and X is less than N; C1 is a resistance-capacitance delay generated on a branch transmission section when the branch transmission section passes through a row of pixel region and a row of shift register region and is connected to a shift register; and C2 is a resistance-capacitance delay generated on the branch transmission section when the branch transmission section passes through the row of pixel region and the row of shift register region.

In some embodiments, the at least two groups of shift registers include a first group of shift registers, a second group of shift registers, and a third group of shift registers that are sequentially away from the main body transmission section. The clock signal line includes a first branch transmission section, a second branch transmission section, and a third branch transmission section. The first branch transmission section includes at least a second portion extending along a column direction in which the first group of shift registers are arranged, and each shift register in the first group of shift registers is connected in parallel to the second portion of the first branch transmission section. The second branch transmission section includes a first portion and a second portion that are connected to each other. The first portion of the second branch transmission section is further connected to the main body transmission section, the second portion of the second branch transmission section extends along the column direction in which the second group of shift registers are arranged, and each shift register in the second group of shift registers is connected in parallel to the second portion of the second branch transmission section. The third branch transmission section includes a first portion and a second portion that are connected to each other. The first portion of the third branch transmission section is further connected to the main body transmission section, the second portion of the third branch transmission section extends along the column direction in which the third group of shift registers are arranged, and each shift register in the third group of shift registers is connected in parallel to the second portion of the third branch transmission.

In some embodiments, orthographic projections of the plurality of shift registers on the substrate are located in N rows of shift register regions, orthographic projections of the first group of shift registers on the substrate are located in X rows of shift register regions, orthographic projections of the second group of shift registers on the substrate are located in Y rows of shift register regions, and orthographic projections of the third group of shift registers on the substrate are located in (N−X−Y) rows of shift register regions. The second portion of the first branch transmission section passes through the X rows of shift register regions. The first portion of the second branch transmission section passes through the X rows of shift register regions, and the second portion of the second branch transmission section passes through the Y rows of shift register regions. The first portion of the third branch transmission section passes through (X+Y) rows of shift register regions, and the second portion of the third branch transmission section passes through the (N−X−Y) rows of shift register regions. X, Y, and N satisfy that:

$$X \cdot C1 = Y \cdot C1 + X \cdot C2; \text{ and}$$

$$X \cdot C1 = (N-X-Y) \cdot C1 + (X+Y) \cdot C2;$$

where X, Y, and N are all positive integers, and X and Y are both less than N; C1 is a resistance-capacitance delay generated on a branch transmission section when the branch transmission section passes through a row of pixel region and a row of shift register region and is connected to a shift register; and C2 is a resistance-capacitance delay generated on the branch transmission section when the branch transmission section passes through the row of pixel region and the row of shift register region.

In some embodiments, the at least two groups of shift registers include a first group of shift registers, a second group of shift registers, a third group of shift registers, and a fourth group of shift registers that are sequentially away from the main body transmission section. The clock signal line includes a first branch transmission section, a second branch transmission section, a third branch transmission section, and a fourth branch transmission section. The first branch transmission section includes at least a second portion extending along a column direction in which the first group of shift registers are arranged, and each shift register in the first group of shift registers is connected in parallel to the second portion of the first branch transmission section. The second branch transmission section includes a first portion and a second portion that are connected to each other. The first portion of the second branch transmission section is further connected to the main body transmission section, the second portion of the second branch transmission section extends along the column direction in which the second group of shift registers are arranged, and each shift register in the second group of shift registers is connected in parallel to the second portion of the second branch transmission section. The third branch transmission section includes a first portion and a second portion that are connected to each other. The first portion of the third branch transmission section is further connected to the main body transmission section, the second portion of the third branch transmission section extends along the column direction in which the third group of shift registers are arranged, and each shift register in the third group of shift registers is connected in parallel to the second portion of the third branch transmission section. The fourth branch transmission section includes a first portion and a second portion that are connected to each other. The first portion of the fourth branch transmission section is further connected to the main body transmission section, the second portion of the fourth branch transmission section extends along the column direction in which the fourth group of shift registers are arranged, and each shift register in the fourth group of shift registers is connected in parallel to the second portion of the fourth branch transmission section.

In some embodiments, orthographic projections of the plurality of shift registers on the substrate are located in N rows of shift register regions, orthographic projections of the first group of shift registers on the substrate are located in X rows of shift register regions, orthographic projections of the second group of shift registers on the substrate are located in Y rows of shift register regions, orthographic projections of the third group of shift registers on the substrate are located in Z rows of shift register regions, and orthographic projections of the fourth group of shift registers on the substrate are located in (N−X−Y−Z) rows of shift register regions. The second portion of the first branch transmission section passes through the X rows of shift register regions. The first portion of the second branch transmission section passes through the X rows of shift register regions, and the second portion of the second branch transmission section passes through the Y rows of shift register regions. The first portion of the third branch transmission section passes through (X+Y) rows of shift register regions, and the second portion of the third branch transmission section passes through the Z rows of shift register regions. The first portion of the fourth branch transmission section passes through (X+Y+Z) rows of shift register regions, and the second portion of the fourth branch transmission section passes through the (N−Y−Z) rows of shift register regions. X, Y, Z, and N satisfy that:

$X \cdot C1 = Y \cdot C1 + X \cdot C2$ $X \cdot C1 = Z \cdot C1 + (X+Y) \cdot C2$; and $X \cdot C1 = (N-X-Y-Z) \cdot C1 + X+Y+Z) \cdot C2$;

where X, Y, Z, and N are all positive integers, and X, Y, and Z are all less than N; C1 is a resistance-capacitance delay generated on a branch transmission section when the branch transmission section passes through a row of pixel region and a row of shift register region and is connected to a shift register; and C2 is a resistance-capacitance delay generated on the branch transmission section when the branch transmission section passes through the row of pixel region and the row of shift register region.

In some embodiments, the first branch transmission section further includes a first portion, and the first portion of the first branch transmission section is connected to the second portion of the first branch transmission section and the main body transmission section. A first portion of each branch transmission section includes a horizontal portion extending along a row direction, and lengths of horizontal portions of the branch transmission sections are substantially equal.

In another aspect, a display panel is provided. The display panel includes the array substrate as described in any of the above embodiments.

In yet another aspect, a display device is provided. The display device includes the display panel as described in any of the above embodiments.

In yet another aspect, a manufacturing method of an array substrate is provided. The manufacturing method includes: providing a substrate; and forming at least one gate driving circuit and at least one clock signal line on a same side of the substrate. A gate driving circuit includes a plurality of shift registers that are cascaded, and the plurality of shift registers are respectively located in different rows. The plurality of shift registers are divided into at least two groups of shift registers, each group of shift registers includes at least one shift register located in a same column. A pate driving circuit in the at least one gate driving circuit corresponds to at least one clock signal line. The clock signal line includes a main body transmission section and at least two branch transmission sections connected to the main body transmission section. The main body transmission section is configured to transmit a dock signal, and each branch transmission section is connected to a clock signal input terminal of each shift register in a group of shift registers.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods, and actual timings of signals to which the embodiments of the present disclosure relate.

DETAILED DESCRIPTION

Figure 1:
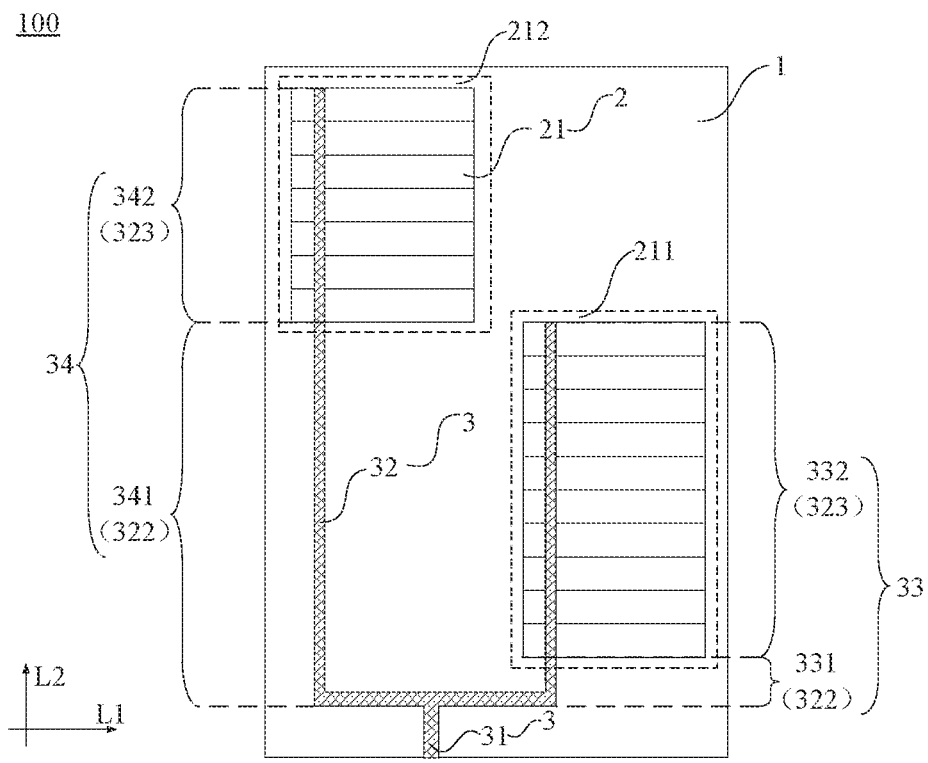
FIG. 1 is a structural diagram of an array substrate, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description, terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms such as "first" and "second" are used for descriptive purposes only, and are not to be construed as indicating or implying relative importance or implicitly indicating the number of indicated technical features. Thus, features defined with "first" or "second" may explicitly or implicitly include one or more of the features. In the description of the embodiments of the present disclosure, the term "a plurality of", "the plurality of" or "multiple" means two or more unless otherwise specified.

In the description of some embodiments, terms "coupled" and "connected" and their derivatives may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "applicable to" or "configured to" used herein has an open and inclusive meaning, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein includes a stated value and an average value within an acceptable range of deviation of a particular value. The acceptable range of deviation is determined by a person of ordinary skill in the art in view of the measurement in question and errors associated with the measurement of a particular quantity (i.e., the limitations of the measurement system).

Exemplary embodiments are described herein with reference to sectional views and/or plan views as idealized exemplary drawings. In the accompanying drawings, thicknesses of layers and regions are enlarged for clarity. Thus, variations in shapes relative to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide an array substrate 100. As shown in FIG. 1, the array substrate 100 includes a substrate 1, at least one gate driving circuit 2, and at least one dock signal line 3. The at least one gate driving circuit 2 is located on a side of the substrate 1, and the dock signal line 3 and the gate driving circuit 2 are located on the same side of the substrate 1. A gate driving circuit 2 corresponds to at least one dock signal line 3. That is, a gate driving circuit 2 may be connected to a clock signal line 3 (as shown in FIG. 1), or a gate driving circuit 2 may be connected to two or more clock signal lines 3.

The gate driving circuit 2 includes a plurality of shift registers 21 that are cascaded, and the plurality of shift registers 21 are respectively located in different rows. The plurality of shift registers 21 are divided into at least two groups of shift registers 21, each group of shift registers 21 include at least one shift register 21, and shift register(s) 21 in each group of shift registers 21 are all located in a same column.

The clock signal line 3 includes a main body transmission section 31 and at least two branch transmission sections 32 connected to the main body transmission section 31. The main body transmission section 31 is configured to transmit a clock signal. Each branch transmission section 32 is connected to a clock signal input terminal of each shift register 21 in a respective group of shift registers 21.

It will be understood that, in a case where a gate driving circuit 2 corresponds to a clock signal line 3, each shift register 21 in the gate driving circuit 2 has a clock signal input terminal; whereas in a case where a gate driving circuit 2 corresponds to two clock signal lines 3, each shift register 21 in the gate driving circuit 2 has two clock signal input terminals. Therefore, the number of clock signal lines 3 corresponding to a gate driving circuit 2 is equal to the number of clock signal input terminals of each shift register 21 in the gate driving circuit 2.

It will be noted that, in the related art, a plurality of shift registers in a gate driving circuit are arranged in a column, and are all connected in parallel to a section of a clock signal line (e.g., a branch transmission section). In a process of unidirectional transmission of an electric signal in the clock signal line, a certain resistance-capacitance delay will be generated each time the electric signal passes through one shift register. Therefore, a problem of output abnormality in shift registers proximate to an end of the clock signal line is easily caused by a large resistance-capacitance delay.

However, in some embodiments of the present disclosure, each clock signal line 3 includes at least two branch transmission sections 32, and the branch transmission sections 32 are in a one-to-one correspondence with and connected to the groups of shift registers 21 in the gate driving circuit 2, so that each branch transmission section 32 may provide a clock signal for each shift register 21 in a respective group of shift registers 21, so as to control the shift register 21 to output a gate control signal. Therefore, compared with a case where all shift registers of the gate driving circuit are connected in parallel to the section of the clock signal line in the related art, in some embodiments of the present disclosure, the number of shift registers 21 connected to each branch transmission section 32 is reduced, and a total resistance-capacitance delay on each branch transmission section 32 is small, that is, a resistance-capacitance delay at an end of each branch transmission section 32 away from the main body transmission section 31 is small. As a result, it is possible to help to ameliorate the problem of output abnormality in the shift registers proximate to the end of the clock signal line due to the large resistance-capacitance delay.

Figure 2:
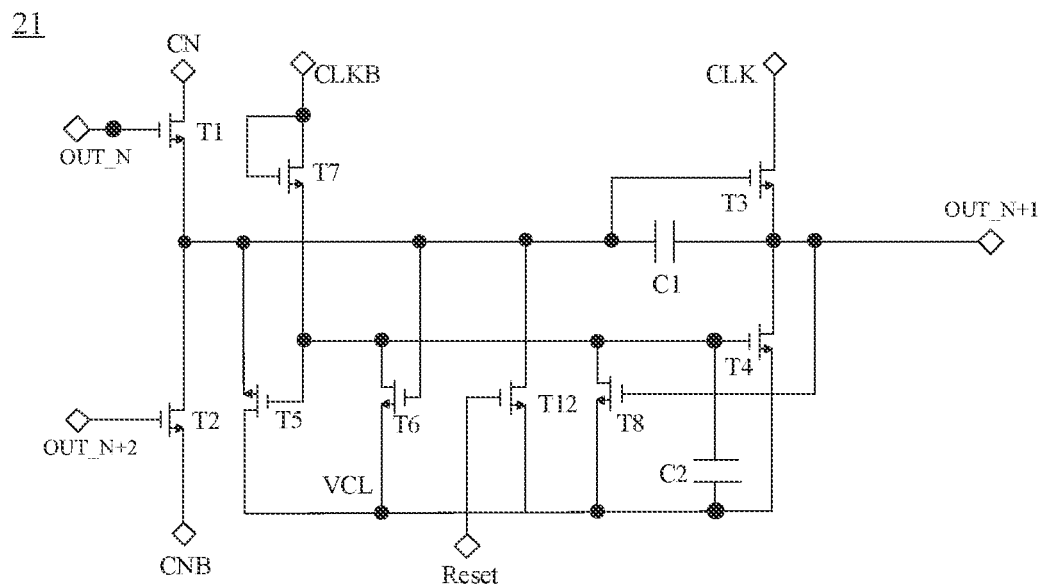
FIG. 2 is a circuit configuration diagram of a shift register, in accordance with some embodiments.

It will be noted that a circuit configuration of the shift register 21 is not limited herein. For example, the circuit configuration of the shift register 21 may be as shown in FIG. 2. In this case, the shift register 21 includes two clock signal input terminals, i.e., CLK and CLKB. In this way, a gate driving circuit 2 composed of the plurality of shift registers 21 as shown in FIG. 2 may correspond to two clock signal lines 3.

In addition, in some embodiments of the present disclosure, although the plurality of shift registers 21 in the gate driving circuit 2 are divided into at least two groups of shift registers 21, all shift registers 21 in the gate driving circuit 2 still remain cascaded. That is, two shift registers 21 located in two adjacent rows and in different groups are still cascaded through signal line(s).

Figure 3:
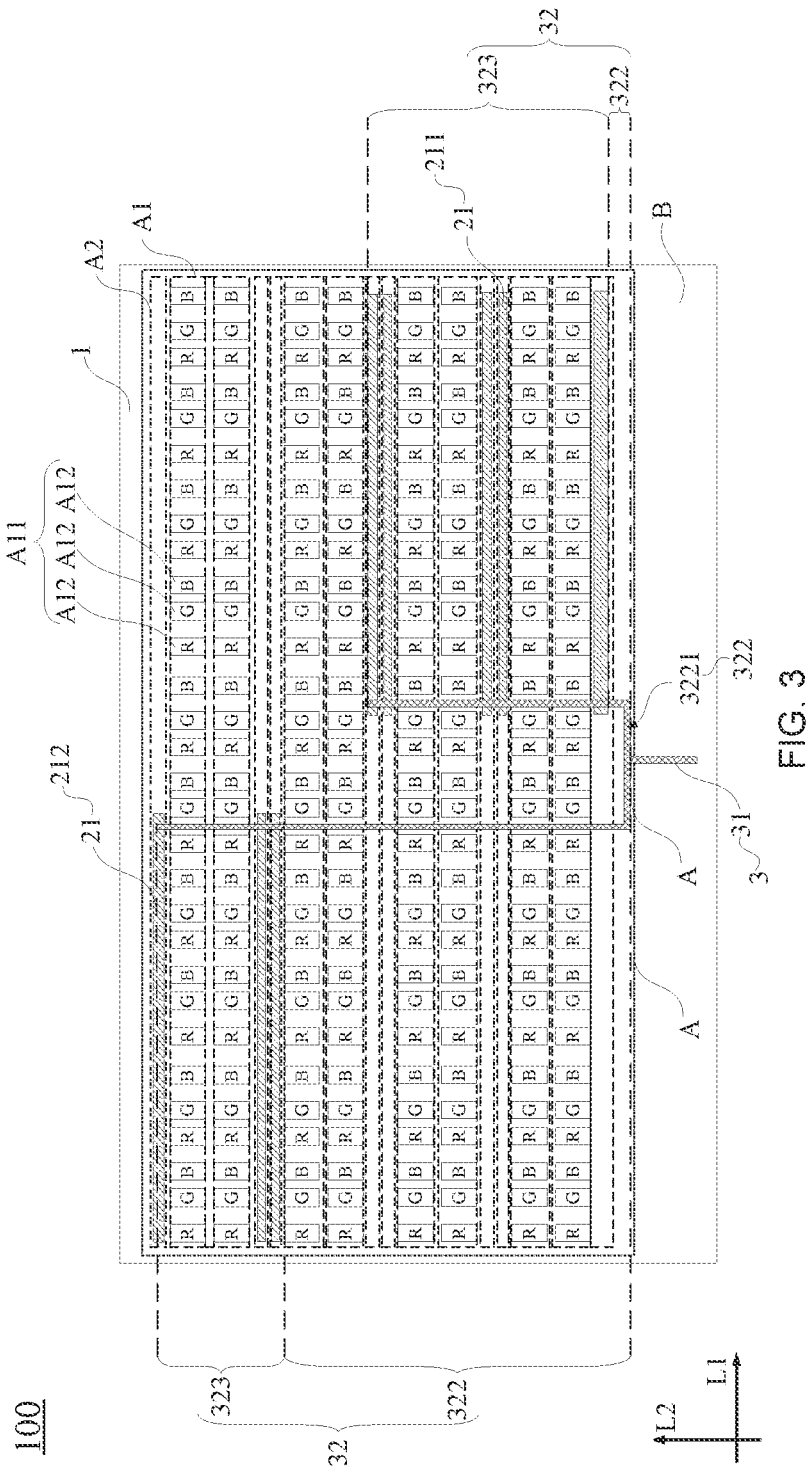
FIG. 3 is a structural diagram of another array substrate, in accordance with some embodiments.

In some embodiments, as shown in FIG. 3, the substrate 1 includes a display area A and a non-display area B located on at least one side of the display area A. The display area A includes a plurality of rows of pixel regions A1 and a plurality of rows of shift register regions A2 that are in a one-to-one correspondence. A row of pixel region A1 and a respective row of shift register region A2 are arranged adjacently. Orthographic projections of the plurality of shift registers 21 in the gate driving circuit 2 on the substrate 1 are in a one-to-one correspondence with and located in the plurality of rows of shift register regions A2. An orthographic projection of the main body transmission section 31 on the substrate 1 is located in the non-display area B, and orthographic projections of the branch transmission sections 32 on the substrate 1 are located in the display area A.

With this arrangement, the orthographic projections of the plurality of shift registers 21 in the gate driving circuit 2 on the substrate 1 are in a one-to-one correspondence with and located in the plurality of rows of shift register regions A2. That is, an orthographic projection of the gate driving circuit 2 on the substrate 1 is located in the display area A. As a result, the gate driving circuit 2 does not need to occupy the non-display area B of the substrate 1, so that an area of the non-display area B of the substrate 1 is reduced. This helps to reduce a width of a bezel of a display device adopting the array substrate 100 and realize a design of a narrow bezel of the display device.

In some embodiments, in two rows of shift register regions A2 corresponding to two adjacent rows of pixel regions A1, each row of shift register region A2 may be located on a same side of a respective pixel region A1.

Alternatively, in some other embodiments, as shown in FIG. 3, in two rows of shift register regions A2 corresponding to two adjacent rows of pixel regions A1 one row of shift register region A2 is located on a first side, proximate to the one row of shift register region A2, of a pixel region A1 corresponding to the one row of shift register region A2, and another row of shift register region A2 is located on a second side, proximate to the another row of shift register region A2, of a pixel region A1 corresponding to the another row of shift register region A2. With this arrangement, two rows of shift register regions A2 may be provided successively every two rows of pixel regions A1 (that is, no pixel region A1 is provided between the two rows of shift register regions A2). In this case, there is a short distance between the two rows of shift register regions A2, so that a distance between two shift registers 21 corresponding to the two shift register regions A2 is also short. Therefore, a signal line shared between the two shift registers 21 (i.e., a signal line extending along a row direction L1) may be provided between the two shift registers 21, which is beneficial to reduce the number of signal lines that are arranged, thereby helping to simplify a structure of the array substrate 100.

Figure 4:
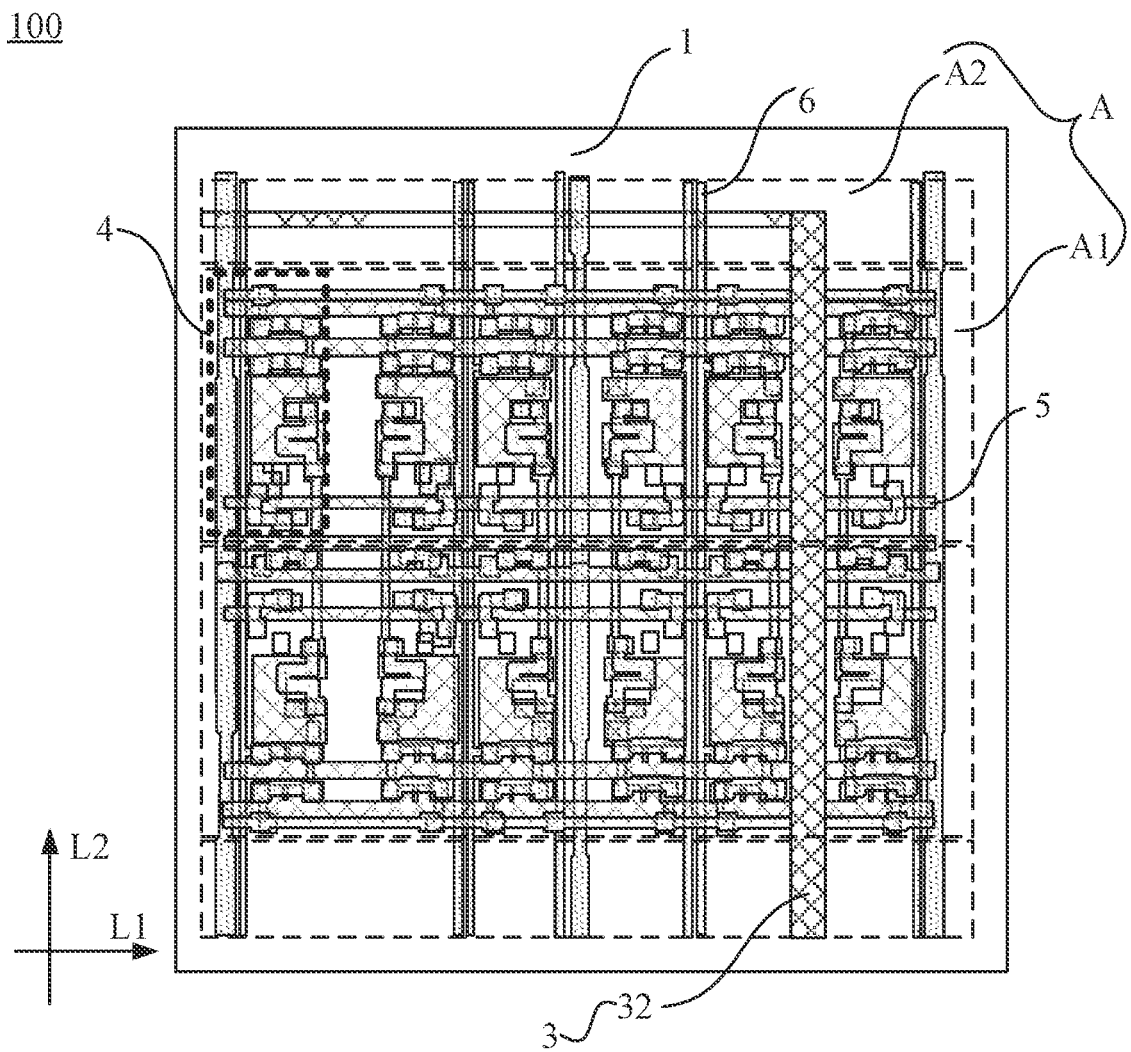
FIG. 4 is a structural diagram of yet another array substrate, in accordance with some embodiments.

It is worth noting that, as shown in FIG. 4, pixel driving circuits 4, gate lines 5, and data lines 6 may further be provided on the side of the substrate 1 where the gate driving circuit(s) 2 and the dock signal line(s) 3 are disposed. Orthographic projections of the pixel driving circuits 4, the gate lines 5, and the data lines 6 on the substrate 1 are all located in the display area A. The gate lines 5 may extend along the row direction L1, and the data lines 6 may extend along a column direction L2.

The row direction L1 and the column direction L2 are both parallel with a plane where the substrate 1 is located. For example, as shown in FIGS. 1 and 3, the row direction L1 and the column direction L2 are perpendicular to each other. Of course, they are not limited in the present disclosure. In some other examples, the row direction L1 and the column direction L2 only need to intersect. For example, there may be an angle between the row direction L1 and the column direction L2, and the angle may be 60 degrees or 80 degrees.

In this way, referring to FIG. 4, there are overlapping regions between an orthographic projection, on the substrate 1, of a portion of a branch transmission section 32 extending along the column direction L2 in which the shift registers 21 are arranged and orthographic projections of gate lines 5 on the substrate 1.

In addition, referring to FIG. 4, the branch transmission section 32 further includes a portion extending along the row direction L1. There are overlapping regions between an orthographic projection, on the substrate 1 of the portion of the branch transmission section 32 extending along the row direction L1 and orthographic projections of data lines 6 on the substrate 1.

In some embodiments, the main body transmission section 31 is located on either side of the display area A in the column direction L2 (e.g., FIG. 3 illustrates that the main body transmission section 31 is located on a lower side of the display area A in the column direction L2). The at least two groups of shift registers 21 are a first group of shift registers 211 to an M-th group of shift registers 21M in sequence in a direction away from the main body transmission section 31, and M is greater than or equal to 2. For example, the at least two groups of shift registers 21 in FIG. 1 are divided into a first group of shift registers 211 and a second group of shift registers 212.

It is found through research that a resistance-capacitance delay is easily generated on a portion of a clock signal line extending along a column direction and located in a pixel region due to gate lines, thereby causing an abnormality in the portion of the clock signal (e.g., a decreased voltage and increased fall time) transmitted on the clock signal. As a length of the portion of the clock signal extending along the column direction increases, the capacitance-resistance delay on the portion of the clock signal also gradually increases. In addition, a resistance-capacitance delay is easily generated on a portion of the clock signal line extending along a row direction and located in a pixel region due to data lines, thereby causing an abnormality in the portion of the clock signal transmitted on the clock signal. As a length of the portion of the clock signal extending along the row direction increases, the capacitance-resistance delay on the portion of the clock signal also gradually increases. Based on this, for example, as shown in FIG. 1, the number of shift registers 21 in each group of shift registers 21 gradually decreases from the first group of shift registers 211 to the M-th group of shift registers 21M. With this arrangement, the resistance-capacitance delay on each branch transmission section 32 is small, which ameliorates a problem that output abnormality easily occurs in the shift registers connected to the end of the clock signal line due to the large resistance-capacitance delay at the end of the clock signal line.

Based on this, from the first group of shift registers 211 to the M-th group of shift registers 21M, the number of shift registers 21 in each group of shift registers is gradually reduced, and it is also possible to make the resistance and capacitance at the end of the branch transmission section 32 connected to the group of shift registers away from the main body transmission section 31 small, thereby further ameliorating the problem that the output abnormality easily occurs in the shift registers connected to the end of the clock signal line due to the large resistance-capacitance delay at the end of the clock signal line.

Figure 5:
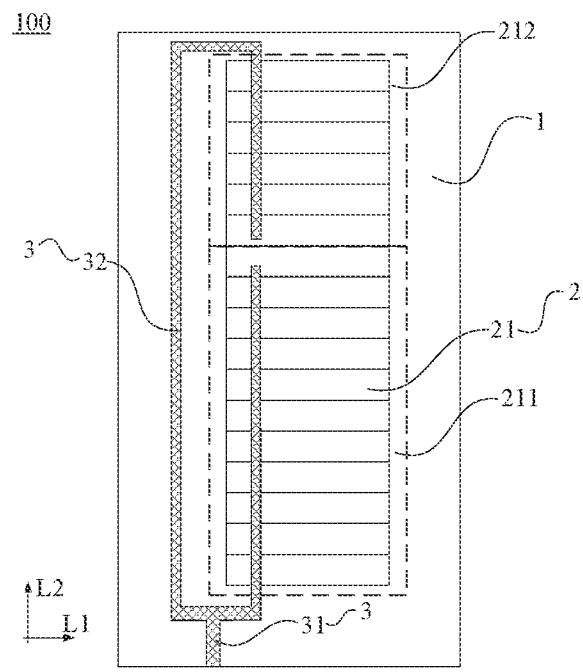
FIG. 5 is a structural diagram of yet another array substrate, in accordance with some embodiments.

For example, from the first group of shift registers 211 to the M-th group of shift registers 21M, any two adjacent groups of shift registers 21 are in a same column Referring to FIG. 5, the first group of shift registers 211 and the second group of shift registers 212 are located in a same column. That is, the groups of shift registers 21 may be located in a same column on the substrate 1, and in this case, it is convenient to cascade the plurality of shift registers 21 in the gate driving circuit 2 together.

Figure 6:
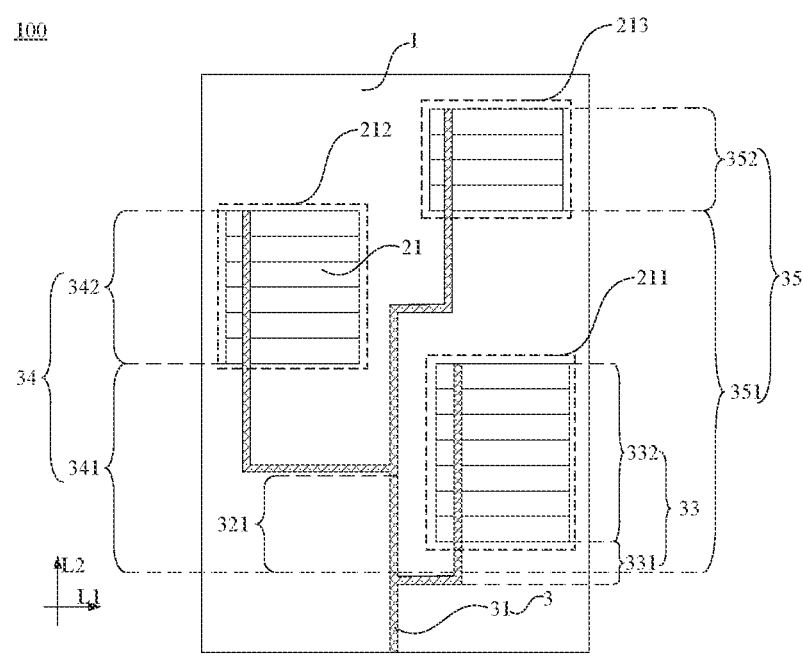
FIG. 6 is a structural diagram of yet another array substrate, in accordance with some embodiments.

As another example, from the first group of shift registers 211 to the M-th group of shift registers 21M, any two adjacent groups of shift registers 21 are not located in a same column. Referring to FIG. 6, the first group of shift registers 211 and the second group of shift registers 212 are located in different columns. With this arrangement, in one aspect, it is convenient for the branch transmission sections 32 to be connected to respective shift registers 21. That is, each branch transmission section 32 can extend from a proximal end of a respective group of shift registers to a distal end of the respective group of shift registers. As a result, the number of the gate lines crossed by each branch transmission section 32 is reduced, and the resistance-capacitance delay at the end of each branch transmission section 32 is reduced. A distal end of each group of shift registers 21 is an end of the group of shift registers 21 away from the main body transmission section 31, and a proximal end of each group of shift registers 21 is an end of the group of shift registers 21 proximate to the main body transmission section 31.

In another aspect, by arranging any two adjacent groups of shift registers 21 in different columns, it may also be possible to facilitate arranging the branch transmission section 32 between the two adjacent groups of shift registers 21 (referring to FIG. 6). As a result, the lengths of portions of the branch transmission sections 32 extending along the row direction L1 are reduced, and the number of the data lines 6 crossed by the portions of the branch transmission sections 32 extending along the row direction L1 is reduced, thereby reducing the resistance-capacitance delay on the portions of the branch transmission sections 32 extending along the row direction L1, reducing the total resistance-capacitance delay on the branch transmission sections 32, and ameliorating the problem that the output abnormality easily occurs in the shift registers connected to the end of the clock signal line due to the large resistance-capacitance delay on the clock signal line.

In some embodiments, in a case where M is greater than or equal to 3 (that is, the gate driving circuit 2 includes at least three groups of shift registers 21), referring to FIG. 6, for any of the clock signal line(s) 3, at least two branch transmission sections 32 among all branch transmission sections 32 connected to the second group of shift registers 212 to the M-th group of shift registers 21M include a common portion 321. With this arrangement, the common portion 321 may be shared among remaining branch transmission sections 32 except a branch transmission section 32 connected to the first group of shift registers 21, thereby simplifying wiring structures of the remaining branch transmission sections 32 except the branch transmission section 32 connected to the first group of shift registers 211, and reducing costs.

For example, as shown in FIG. 6, there is a group of shift registers 21 closest to the main body transmission section 31 in at least two groups of shift registers 21 connected to the at least two branch transmission sections 32 including the common portion 321, and the common portion 321 is located on a side of the group of shift registers 21 proximate to the main body transmission section 31.

In some embodiments, as shown in FIG. 1, each branch transmission section 32 includes a first portion 322 connected to the main body transmission section 31 and a second portion 323 connected to the first portion 322. Each second portion 323 extends along the column direction L2 in which a respective group of shift registers 21 are arranged, and a group of shift registers 21 corresponding to each second portion 323 are connected in parallel to the second portion 323.

In some embodiments, referring to FIG. 3, each row of pixel region A1 is provided with a plurality of sub-pixels A12 (e.g., R, G, and B) therein, and the plurality of sub-pixels A12 are sequentially arranged in the row direction L1. For example, in each row of pixel region A1, three adjacent sub-pixels A12 may be used as a pixel unit, and the three sub-pixels A12 in the pixel unit may be used to generate light with three primary colors (e.g., red light, green light, and blue light).

Referring to FIGS. 3 and 4, in any of the clock signal line(s) 3, first portions 322 of all branch transmission sections 32 each cross no more than 100 pixels A11 in the row direction L1 In some examples, one pixel A11 refers to one sub-pixel A12. In some other examples, one pixel A11 refers to one pixel unit (as shown in FIG. 3, one pixel A11 includes three sub-pixels A12).

With this arrangement, the number of pixels crossed by the first portions 322 of all the branch transmission sections 32 extending along the row direction L1 is small, and the number of data lines 6 crossed by the first portions 322 of the branch transmission sections 32 extending along the row direction L1 is also small, Therefore, the resistance-capacitance delay on portions of the first portions 322 of the branch transmission sections 32 extending along the row direction L1 is small, which is further beneficial to reduce the total resistance-capacitance delay on the branch transmission sections 32 and improve the problem that the output abnormality easily occurs in the shift registers 21 connected to the end of the clock signal line 3 due to the large resistance-capacitance delay at the end of the clock signal line 3.

In some embodiments, the resistance-capacitance delays at ends of all the branch transmission sections 32 away from the main body transmission section 31 are approximately equal. In this way, waveforms of clock signals received by the shift registers 21 connected to the ends of the branch transmission sections 32 are the same or substantially the same. That is, the clock signals transmitted at the ends of the branch transmission sections 32 are the same or substantially the same. That is, signals received by the shift registers connected to the ends of the branch transmission sections 32 are the same or substantially the same, and times at which the shift registers connected to the ends of the branch transmission sections 32 output gate control signals are the same or substantially the same, which improves reliabilities of the gate control signals output by the groups of shift registers 21 in the gate driving circuit 2.

In some embodiments, as shown in FIG. 1, the at least two groups of shift registers include a first group of shift registers 211 and a second group of shift registers 212 that are sequentially away from the main body transmission section 31. The branch transmission sections 32 includes a first branch transmission section 33 and a second branch transmission section 34. The first branch transmission section 33 includes at least a second portion 332 extending along the column direction L2 in which the first group of shift registers 211 are arranged, and each shift register 21 in the first group of shift registers 211 is connected in parallel to the second portion 332 of the first branch transmission section 33. The second branch transmission section 34 includes a first portion 341 and a second portion 342 that are connected to each other. The first portion 341 of the second branch transmission section 34 is further connected to the main body transmission section 31. The second portion 342 of the second branch transmission section 34 extends along the column direction L2 in which the second group of shift registers 212 are arranged, and each shift register 21 in the second group of shift registers 212 is connected in parallel to the second portion 342 of the second branch transmission section 34.

The second portion 332 of the first branch transmission section 33 may be directly connected to the main body transmission section 31. Alternatively, as shown in FIG. 1, the first branch transmission section 33 may further include a first portion 331 used to connect the second portion 332 and the main body transmission section 31.

In this way, the plurality of shift registers 21 in the gate driving circuit 2 are divided into two groups, and two branch transmission sections 32 are used to provide clock signals for the two groups of shift registers 21, respectively. In one aspect, it is possible to make the number of shift registers 21 connected to each branch transmission section 32 small, reduce the resistance-capacitance delay on the branch transmission section 32, and ameliorate the problem that the output abnormality easily occurs in the shift registers connected to the end of the clock signal line due to the large resistance-capacitance delay on the clock signal line. In another aspect, grouping of the shift register 21 is simple, which may simplify a wiring structure and reduce costs.

Based on this, as shown in FIGS. 1 and 3, orthographic projections of the plurality of shift registers 21 on the substrate 1 may be respectively located in N rows of shift register regions A2. Orthographic projections of the first group of shift registers 211 on the substrate 1 may be located in X rows of shift register regions A2, and orthographic projections of the second group of shift registers 212 on the substrate 1 may be located in (N−X) rows of shift register regions A2. The second portion 332 of the first branch transmission section 33 may pass through the X rows of shift register regions A2. The first portion 341 of the second branch transmission section 34 may pass through the X rows of shift register regions A2, and the second portion 342 of the second branch transmission section 34 may pass through the (N−X) rows of shift register regions A2. X and N satisfy that:

$$X \cdot C1 = (N-X) \cdot C1 + X \cdot C2.$$

Where X and N are both positive integers, X is less than N, C1 is a resistance-capacitance delay generated on a branch transmission section 32 when the branch transmission section 32 passes through a row of pixel region A1 and a row of shift register region A2 and is connected to a shift register 21; and C2 is a resistance-capacitance delay generated on the branch transmission section 32 when the branch transmission section 32 passes through the row of pixel region A1 and the row of shift register region A2.

It may be derived from the above equation that:

$$X = \frac{N \cdot C1}{(2C1 - C2)}.$$

In a case where values of C1, C2, and N are known, a value of X may be calculated. C1 and 02 may have different values according to different structures of products. For example, C1 may be 60 fF, and C2 may be 30 fF. Similarly, the number N of rows of shift register regions A2 may also be different according to different pixel structures of the products, and the number of the shift register regions A2 is not limited in the present disclosure.

In some other embodiments, as shown in FIG. 6, the at least two groups of shift registers 21 include a first group of shift registers 211, a second group of shift registers 212, and a third group of shift registers 213 that are sequentially away from the main body transmission section 31. The clock signal line 3 includes a first branch transmission section 33, a second branch transmission section 34, and a third branch transmission section 35.

The first branch transmission section 33 includes at least a second portion 332 extending along the column direction L2 in which the first group of shift registers 211 are arranged, and each shift register 21 in the first group of shift registers 211 is connected in parallel to the second portion 332 of the first branch transmission section 33. The second branch transmission section 34 includes a first portion 341 and a second portion 342 that are connected to each other. The first portion 341 of the second branch transmission section 34 is further connected to the main body transmission section 31. The second portion 342 of the second branch transmission section 34 extends along the column direction L2 in which the second group of shift registers 212 are arranged, and each shift register 21 in the second group of shift registers 212 is connected in parallel to the second portion 342 of the second branch transmission section 34. The third branch transmission section 35 includes a first portion 351 and a second portion 352 that are connected to each other. The first portion 351 of the third branch transmission section 35 is further connected to the main body transmission section 31. The second portion 352 extends along the column direction L2 in which the third group of shift registers 213 are arranged, and each shift register 21 in the third group of shift registers 213 is connected in parallel to the second portion 352 of the third group of shift registers 213.

The second portion 332 of the first branch transmission section 33 may be directly connected to the main body transmission section 31. Alternatively, as shown in FIG. 6, the first branch transmission section 33 may further include a first portion 331 used to connect the second portion 332 and the main body transmission section 31.

With this arrangement, the number of shift registers 21 connected to each branch transmission section 32 of the clock signal line 3 is small, and the resistance-capacitance delay on each branch transmission section 32 is small, which is more conducive to ameliorating the problem that the output abnormality easily occurs in the shift registers connected to the end of the clock signal line due to the large resistance-capacitance delay on the clock signal line.

Based on this, as shown in FIG. 6, orthographic projections of the plurality of shift registers 21 on the substrate 1 may be respectively located in N rows of shift register regions A2. Orthographic projections of the first group of shift registers 211 on the substrate 1 may be located in X rows of shift register regions A2, orthographic projections of the second group of shift registers 212 on the substrate 1 may be located in Y rows of shift register regions A2, and orthographic projections of the third group of shift registers 213 on the substrate 1 may be located in (N−X−Y) rows of shift register regions A2.

The second portion 332 of the first branch transmission section 33 may pass through the X rows of shift register regions A2. The first portion 341 of the second branch transmission section 34 may pass through the X rows of shift register regions A2, and the second portion 342 of the second branch transmission section 34 may pass through the Y rows of shift register regions A2. The first portion 351 of the third branch transmission section 35 may pass through (X Y) rows of shift register regions A2, and the second portion of the third branch transmission section 35 may pass through the (N−X−Y) rows of shift register regions A2. X, Y, and N satisfy that:

$$X \cdot C1 = Y \cdot C1 + X \cdot C2; \text{ and}$$

$$X \cdot C1 = (N-X-Y) \cdot C1 + (X+Y) \cdot C2$$

Where X, Y, and N are all positive integers, and X and Y are both less than N; C1 is a resistance-capacitance delay generated on a branch transmission section 32 when the branch transmission section 32 passes through a row of pixel region A1 and a row of shift register region A2 and is connected to a shift register 21; and C2 is a resistance-capacitance delay generated on the branch transmission section 32 when the branch transmission section 32 passes through the row of pixel region A1 and the row of shift register region A2.

It may be derived from the above equation that:

$$X = \frac{C1^2 \cdot N}{3C1^2 - 3C1 \cdot C2 + C2^2}; \text{ and}$$

$$Y = \frac{N \cdot (C1^2 - C1 \cdot C2)}{3C1^2 - 3C1 \cdot C2 + C2^2}.$$

In some embodiments, as shown in FIG. 1, the at least two groups of shift registers 21 include a first group of shift registers 211, a second group of shift registers 212, a third group of shift registers 213, and a fourth group of shift registers 214 that are sequentially away from the main body transmission section 31. The clock signal line 3 includes a first branch transmission section 33, a second branch transmission section 34, a third branch transmission section 35, and a fourth branch transmission section 36.

The first branch transmission section 33 includes at least a second portion 332 extending along the column direction L2 in which the first group of shift registers 211 are arranged, and each shift register 21 in the first group of shift registers 211 is connected in parallel to the second portion 332 of the first branch transmission section 33. The second branch transmission section 34 includes a first portion 341 and a second portion 342 that are connected to each other. The first portion 341 of the second branch transmission section 34 is further connected to the main body transmission section 31. The second portion 342 of the second branch transmission section 34 extends along the column direction L2 in which the second group of shift registers 212 are arranged, and each shift register 21 in the second group of shift registers 212 is connected in parallel to the second portion 342 of the second branch transmission section 34. The third branch transmission section 35 includes a first portion 351 and a second portion 352 that are connected to each other. The first portion 351 of the third branch transmission section 35 is further connected to the main body transmission section 31. The second portion 352 of the third branch transmission section 35 extends along the column direction L2 in which the third group of shift registers 213 are arranged, and each shift register 21 in the third group of shift registers 213 is connected in parallel to the second portion 352 of the third branch transmission section 35. The fourth branch transmission section 36 includes a first portion 361 and a second portion 362 that are connected to each other. The first portion 361 of the fourth branch transmission section 36 is further connected to the main body transmission section 31. The second portion 362 of the fourth branch transmission section 36 extends along the column direction L2 in which the fourth group of shift registers 214 are arranged, and each shift register 21 in the fourth group of shift registers 214 is connected in parallel to the second portion 362 of the fourth branch transmission section 36.

The second portion 332 of the first branch transmission section 33 may be directly connected to the main body transmission section 31. Alternatively, as shown in FIG. 7, the first branch transmission section 33 may further include a first portion 331 used to connect the second portion 332 and the main body transmission section 31.

In this way, the plurality of shift registers 21 in the gate driving circuit 2 are divided into four groups, and each group of shift registers 21 are connected to a branch transmission section 32. As a result, the number of the shift registers 21 connected to each branch transmission section 32 is small, and the total resistance-capacitance delay on the branch transmission section is small, so that the problem of output abnormality does not easily appear in the shift registers 21 connected to the end of the branch transmission section 32.

Figure 7:
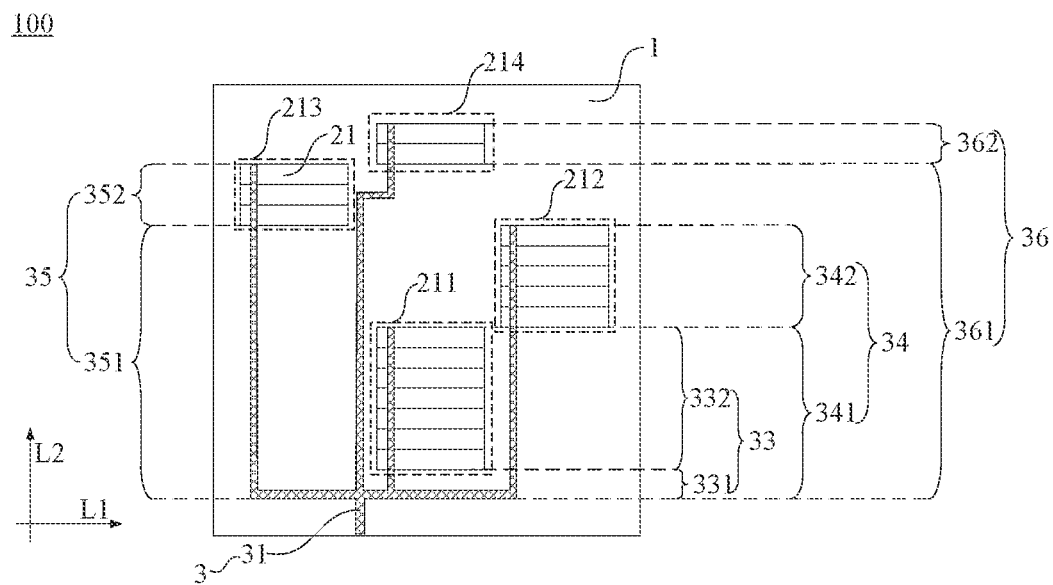
FIG. 7 is a structural diagram of yet another array substrate, in accordance with some embodiments.

Based on this, as shown in FIG. 7, orthographic projections of the plurality of shift registers 21 on the substrate 1 may fall into N rows of shift register regions A2. Orthographic projections of the first group of shift registers 211 on the substrate 1 may fall into X rows of shift register regions A2, orthographic projections of the second group of shift registers 212 on the substrate 1 may fall into Y rows of shift register regions A2, orthographic projections of the third group of shift registers 213 on the substrate 1 may fall into Z rows of shift register regions A2, and orthographic projections of the fourth group of shift registers 214 on the substrate 1 may fall into (N−X−Y−Z) rows of shift register regions A2.

The second portion 332 of the first branch transmission section 33 may pass through the X rows of shift register regions A2. The first portion 341 of the second branch transmission section 34 may pass through the X rows of shift register regions A2, and the second portion 342 of the second branch transmission section 34 may pass through the Y rows of shift register regions A2. The first portion 351 of the third branch transmission section 35 may pass through the (X+Y) rows of shift register regions A2, and the second portion 352 of the third branch transmission section 35 may pass through the Z rows of shift register regions A2. The first portion 361 of the fourth branch transmission section 36 may pass through (X+Y+Z) rows of shift register regions, and the second portion 362 of the fourth branch transmission section 36 may pass through the (N−X−Y−Z) rows of shift register regions. X, Y, Z, and N satisfy that:

$$X \cdot C1 = Y \cdot C1 + X \cdot C2$$

$$X \cdot C1 = Z \cdot C1 + (X+Y) \cdot C2; \text{ and}$$

$$X \cdot C1 = (N-X-Y-Z) \cdot C1 + (X+Y+Z) \cdot C2$$

Where X, Y, Z, and N are all positive integers, and X, Y, and Z are all less than N; C1 is a resistance-capacitance delay generated on a branch transmission section 32 when the branch transmission section 32 passes through a row of pixel region A1 and a row of shift register region A2 and is connected to a shift register 21; and C2 is a resistance-capacitance delay generated on the branch transmission section 32 when the branch transmission section 32 passes through the row of pixel region A1 and the row of shift register region A2.

It may be derived from the above equation that:

$$X = \frac{N \cdot C1^3}{4C1^3 - 6C1^2 \cdot C2 + 4C1 \cdot C2^2 - C2^3};$$

$$Y = \frac{N \cdot (C1^3 - C1^2 \cdot C2)}{4C1^3 - 6C1^2 \cdot C2 + 4C1 \cdot C2^2 - C2^3}; \text{ and}$$

$$Z = \frac{N \cdot C1 \cdot (C1 - C2)^2}{4C1^3 - 6C1^2 \cdot C2 + 4C1 \cdot C2^2 - C2^3}.$$

In some embodiments, as shown in FIGS. 1, 6 and 7, the first branch transmission section 33 may further include a first portion 331, and the first portion 331 of the first branch transmission section 33 is connected to the second portion 332 of the first branch transmission section 33 and the main body transmission section 31. As shown in FIG. 3, The first portion 322 of each branch transmission section 32 includes a horizontal portion 3221 extending along the row direction L1, and lengths of horizontal portions 3221 of the branch transmission sections 32 are substantially equal. In this way, the values calculated through the above equation may be more accurate.

It will be noted that FIGS. 1, 6, and 7 only show a connection of the gate driving circuit 2 and the clock signal line 3 in a case where the plurality of shift registers 21 in the gate driving circuit 2 are divided into two groups of shift registers and the clock signal line includes two branch transmission sections 32, a connection of the gate driving circuit 2 and the clock signal line 3 in a case where the plurality of shift registers 21 in the gate driving circuit 2 are divided into three groups of shift registers and the clock signal line includes three branch transmission sections 32, and a connection of the gate driving circuit 2 and the clock signal line 3 in a case where the plurality of shift registers 21 in the gate driving circuit 2 are divided into four groups of shift registers and the clock signal line includes four branch transmission sections 32, respectively. It will be understood that the technical solutions provided by the present disclosure are not limited thereto. That is, the shift registers 21 in the gate driving circuit 2 may also be divided into five or more groups of shift registers, so that the resistance-capacitance delay on each branch transmission section 32 is small, so as to ameliorate the problem of the output abnormality in the shift registers connected to the end of the clock signal line due to the large resistance-capacitance delay on the clock signal line.

Figure 8:
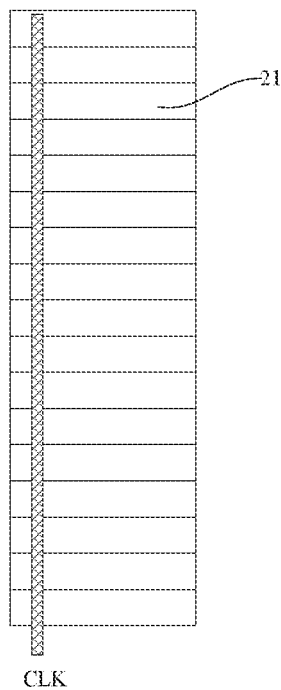
FIG. 8 is a structural diagram of yet another array substrate.
Figure 9:
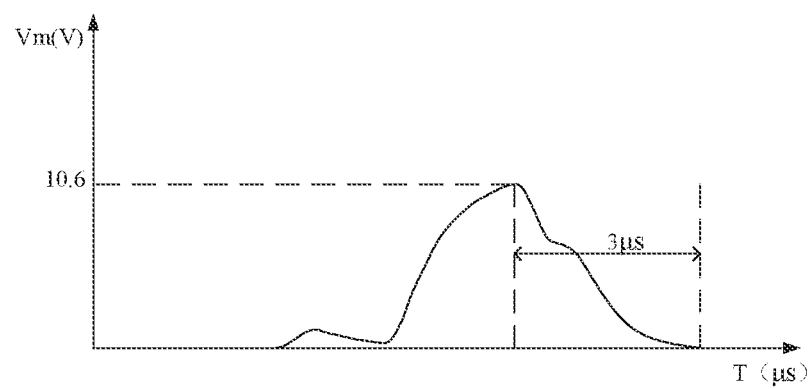
FIG. 9 is a waveform diagram of a clock signal.

Referring to FIGS. 8 and 9, the clock signal line CLK is directly connected to all shift registers in a gate driving circuit, and the resistance-capacitance delay at the end of the clock signal line CLK is large. In this case, when a voltage signal of 12 V is input to the clock signal line CLK, a maximum value of a clock signal voltage Vm output from the end of the clock signal line CLK can only reach 10.6 V, and fall time of the clock signal is 3 μs. In this way, in a case where a clock signal of 12 V is needed to turn on transistors in the shift registers connected to the end of the clock signal line CLK, the clock signal output from the end of the clock signal line CLK is insufficient to turn on the transistors, thereby easily causing the problem of output abnormality of the shift registers.

Figure 10:
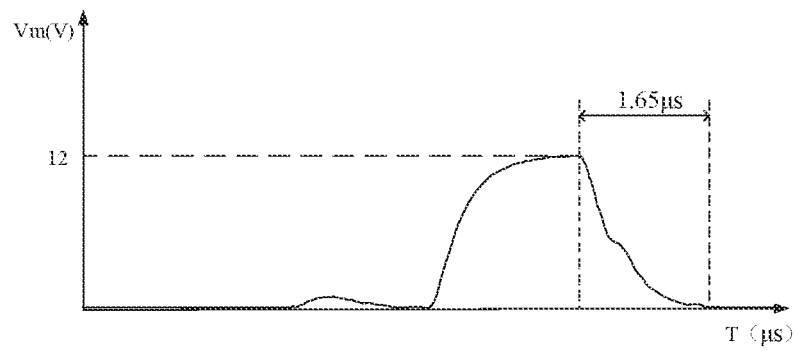
FIG. 10 is a waveform diagram of another clock signal, in accordance with some embodiments.

However, in some embodiments, referring to FIGS. 6 and 10, the clock signal line 3 includes a main body transmission section 31 and three branch transmission sections 32 connected to the main body transmission section 31. Each branch transmission section 32 is connected to a respective group of shift registers 21, In this way, the resistance-capacitance delay at an end of the branch transmission section 32 is small. In this case, when a voltage signal of 12 V is input to the clock signal line 3, a maximum value of a clock signal voltage Vm output from the end of the branch transmission section 32 can reach 12 V, and fall time of the clock signal is only 1.65 μs. In this way, in a case where a clock signal of 12 V is needed to turn on the transistors in the shift registers 21 connected to the end of the branch transmission section 32, the clock signal transmitted by the branch transmission section 32 is sufficient to turn on the transistors, thereby ameliorating the problem of output abnormality of the shift registers. In addition, since the fall time of the clock signal is small, the clock signal may also be used to accurately control the turn-on time of the transistors, thereby ensuring that the shift registers 21 normally output gate control signals.

Figure 11:
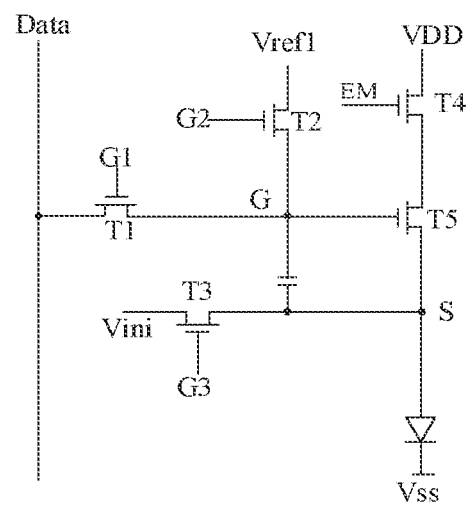
FIG. 11 is a circuit configuration diagram of a pixel driving circuit, in accordance with some embodiments.

The foregoing embodiments all take one gate driving circuit 21 as an example for illustration. It will be understood that the gate driving circuit 2 provides a gate driving signal for a plurality of pixel driving circuits 4 on the array substrate 100. In a case where the pixel driving circuits need to utilize a plurality of gate driving signals, the array substrate 100 may also include a plurality of gate driving circuits. For example, in a case where a pixel driving circuit includes a circuit configuration as shown in FIG. 11 (that is, the pixel driving circuit is provided with four gate signal terminals, i.e., G1, G2, G3, and EM), four gate driving circuits 2 may be provided on the array substrate 1, and respectively provide gate driving signals for the pixel driving circuit.

Figure 12A:
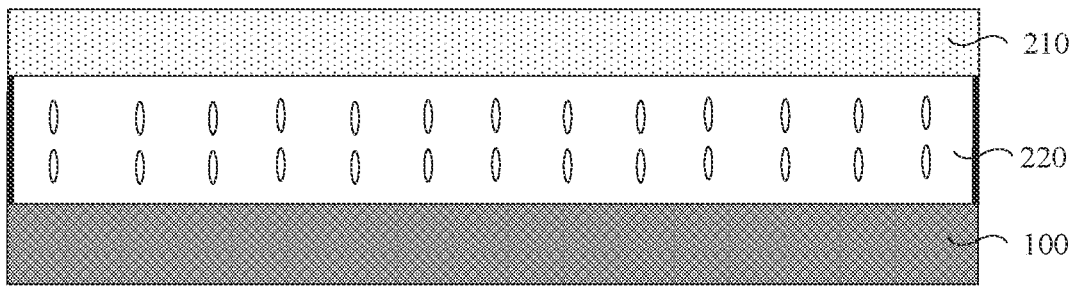
FIG. 12A is a structural diagram of a display panel, in accordance with some embodiments.
Figure 12B:
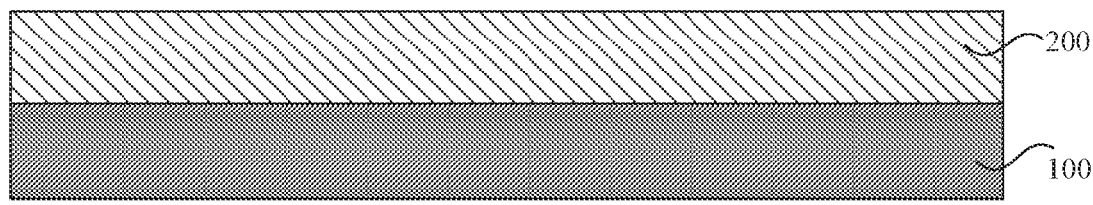
FIG. 12B is a structural diagram of another display panel, in accordance with some embodiments.

Some embodiments of the present disclosure provide a display panel 300. Referring to FIGS. 12A and 12B, the display panel 300 includes the array substrate 100 as described in any of the above embodiments. The display panel 300 may be a liquid crystal display (LCD) panel, an organic light-emitting diode (OLED) display panel, a quantum dot light-emitting diode (QLED) display panel, etc.

In a case where the display panel 300 is the LCD panel, referring to FIG. 12A, the LCD panel may include the array substrate 100, an assembling substrate 210, and a liquid crystal layer 220 provided between the array substrate 100 and the assembling substrate 210.

In a case where the display panel 300 is the OLED display panel (or the QLED display panel), referring to FIG. 12B, the OLED display panel (or the QLED display panel) may include the array substrate 100 and light-emitting devices 200. A light-emitting device 200 may include an anode, a cathode, and a light-emitting functional layer located between the cathode and the anode.

Beneficial effects that can be achieved by the display panel include at least the same beneficial effects as the array substrate provided by the above technical solutions, and will not be repeated herein.

Some embodiments of the present disclosure provide a display device, and the display device includes the display panel provided in the above embodiments. The display device may be any component having a display function, such as a television, a digital camera, a mobile phone, a watch, a tablet computer, a notebook computer, and a navigator. Beneficial effects that can be achieved by the display device are the same as the beneficial effects that can be achieved by the array substrate and the display panel that are provided by the above technical solutions, and will not be repeated herein.

Figure 13:
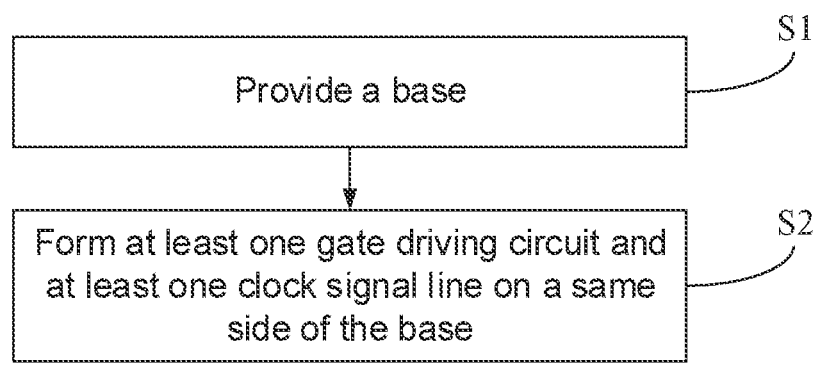
FIG. 13 is a flow diagram of a manufacturing method, in accordance with some embodiments.

Some embodiments of the present disclosure provide a manufacturing method used to manufacture the array substrate described in any of the above embodiments. As shown in FIG. 13, the manufacturing method includes:

S1, providing the substrate 1; and

S2, forming at least one gate driving circuit 2 and at least one clock signal line 3 on a same side of the substrate 1.

A gate driving circuit 2 includes a plurality of shift registers 21 that are cascaded, and the plurality of shift registers 21 are located in different rows. The plurality of shift registers 21 are divided into at least two groups of shift registers 21, each group of shift registers 21 includes at least one shift register 21, and the shift register(s) 21 in each group of shift registers 21 are all located in a same column.

A gate driving circuit 2 corresponds to at least one clock signal line 3. The clock signal line 3 includes a main body transmission section 31 and at least two branch transmission sections 32 connected to the main body transmission section 31. The main body transmission section 31 is configured to transmit a dock signal, and each branch transmission section 32 is connected to a dock signal input terminal of each shift register 21 in a group of shift registers.

In this way, in the array substrate manufactured by adopting the manufacturing method, each clock signal line 3 includes at least two branch transmission sections 32, and the branch transmission sections 32 are in a one-to-one correspondence with and connected to the groups of shift registers 21 in the gate driving circuit 2, so that each branch transmission section 32 may provide a clock signal for each shift register 21 in a respective group of shift registers 21 to control the shift register 21 to output a gate control signal. The number of shift registers 21 connected to each branch transmission section 32 is small, and a total resistance-capacitance delay on each branch transmission section 32 is small, that is, a resistance-capacitance delay at an end of each branch transmission section 32 away from the main body transmission section 31 is small. As a result, it may be possible to help to ameliorate the problem that the output abnormality easily occurs in the shift registers proximate to the end of the clock signal line due to the large resistance-capacitance delay.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising:
a substrate having a display area and a non-display area located on at least one side of the display area;
at least one gate driving circuit including a plurality of shift registers that are cascaded, the plurality of shift registers being respectively located in different rows, the plurality of shift registers being divided into at least two groups of shift registers, each group of shift registers including at least one shift register located in a same column; and
at least one clock signal line, the clock signal line and the gate driving circuit being located on a same side of the substrate, a gate driving circuit in the at least one gate driving circuit corresponding to at least one clock signal line, and the clock signal line including:
a main body transmission section, an orthographic projection of the main body transmission section on the substrate being located in the non-display area, and the main body transmission section being configured to transmit a clock signal; and
at least two branch transmission sections connected to the main body transmission section, orthographic projections of the at least two branch transmission sections on the substrate being located in the display area, and each branch transmission section being connected to a clock signal input terminal of each shift register in a respective group of shift registers.

2. The array substrate according to claim 1, wherein the display area includes a plurality of rows of pixel regions and a plurality of rows of shift register regions that are in a one-to-one correspondence, and a row of pixel region and a respective row of shift register region are arranged adjacently; and
orthographic projections of the plurality of shift registers in the gate driving circuit on the substrate are in a one-to-one correspondence with and located in the plurality of rows of shift register regions.

3. The array substrate according to claim 2, wherein in two rows of shift register regions corresponding to two adjacent rows of pixel regions, each row of shift register region is located on a same side of a respective pixel region; or
one row of shift register region is located on a first side, proximate to the one row of shift register region, of a respective pixel region, and another row of shift register region is located on a second side, proximate to the another row of shift register region, of a respective pixel region.

4. The array substrate according to claim 2, wherein the at least two groups of shift registers are a first group of shift registers to an M-th group of shift registers in sequence in a direction away from the main body transmission section, where M represents a total number of groups included in the at least two groups of shift registers, and M is greater than or equal to 2;
from the first group of shift registers to the M-th group of shift registers, a number of shift registers in each group of shift registers gradually decreases; and/or
from the first group of shift registers to the M-th group of shift registers, any two adjacent groups of shift registers are not located in a same column.

5. The array substrate according to claim 4, wherein in a case where M is greater than or equal to 3, for any of the at least one clock signal line, at least two branch transmission sections among all branch transmission sections connected to a second group of shift registers to the M-th group of shift registers include a common portion.

6. The array substrate according to claim 5, wherein the common portion is located on a side, proximate to the main body transmission section, of a group of shift registers closest to the main body transmission section in at least two groups of shift registers connected to the at least two branch transmission sections including the common portion.

7. The array substrate according to claim 1, wherein the branch transmission section includes a first portion connected to the main body transmission section and a second portion connected to the first portion; and
    the second portion extends along a column direction in which a respective group of shift registers are arranged, and the respective group of shift registers are connected in parallel to the second portion.

8. The array substrate according to claim 7, wherein the first portion of the branch transmission section crosses no more than 100 pixels in a row direction.

9. The array substrate according to claim 1, wherein resistance-capacitance delays at ends of all branch transmission sections away from the main body transmission section are approximately equal.

10. The array substrate according to claim 1, wherein the at least two groups of shift registers include a first group of shift registers and a second group of shift registers that are sequentially away from the main body transmission section; and
    the clock signal line includes a first branch transmission section and a second branch transmission section;
    the first branch transmission section includes at least a second portion extending along a column direction in which the first group of shift registers are arranged, and each shift register in the first group of shift registers is connected in parallel to the second portion of the first branch transmission section; and
    the second branch transmission section includes a first portion and a second portion that are connected to each other, the first portion of the second branch transmission section is further connected to the main body transmission section, the second portion of the second branch transmission section extends along the column direction in which the second group of shift registers are arranged, and each shift register in the second group of shift registers is connected in parallel to the second portion of the second branch transmission section.

11. The array substrate according to claim 10, wherein orthographic projections of the plurality of shift registers on the substrate are respectively located in N rows of shift register regions, orthographic projections of the first group of shift registers on the substrate are located in X rows of shift register regions, and orthographic projections of the second group of shift registers on the substrate are located in (N−X) rows of shift register regions;
    the second portion of the first branch transmission section passes through the X rows of shift register regions;
    the first portion of the second branch transmission section passes through the X rows of shift register regions; and
    the second portion of the second branch transmission section passes through the (N−X) rows of shift register regions, and X and N satisfy that:

$$X \cdot C1 = (N-X)C1 + X \cdot C2;$$

wherein X and N are both positive integers, and X is less than N;
    C1 is a resistance-capacitance delay generated on a branch transmission section when the branch transmission section passes through a row of pixel region and a row of shift register region and is connected to a shift register; and
    C2 is a resistance-capacitance delay generated on the branch transmission section when the branch transmission section passes through the row of pixel region and the row of shift register region.

12. The array substrate according to claim 1, wherein the at least two groups of shift registers include a first group of shift registers, a second group of shift registers, and a third group of shift registers that are sequentially away from the main body transmission section; and the clock signal line includes a first branch transmission section, a second branch transmission section, and a third branch transmission section;
    the first branch transmission section includes at least a second portion extending along a column direction in which the first group of shift registers are arranged, and each shift register in the first group of shift registers is connected in parallel to the second portion of the first branch transmission section;
    the second branch transmission section includes a first portion and a second portion that are connected to each other, the first portion of the second branch transmission section is further connected to the main body transmission section, the second portion of the second branch transmission section extends along the column direction in which the second group of shift registers are arranged, and each shift register in the second group of shift registers is connected in parallel to the second portion of the second branch transmission section; and
    the third branch transmission section includes a first portion and a second portion that are connected to each other, the first portion of the third branch transmission section is further connected to the main body transmission section, the second portion of the third branch transmission section extends along the column direction in which the third group of shift registers are arranged, and each shift register in the third group of shift registers is connected in parallel to the second portion of the third branch transmission.

13. The array substrate according to claim 12, wherein orthographic projections of the plurality of shift registers on the substrate are located in N rows of shift register regions, orthographic projections of the first group of shift registers on the substrate are located in X rows of shift register regions, orthographic projections of the second group of shift registers on the substrate are located in Y rows of shift register regions, and orthographic projections of the third group of shift registers on the substrate are located in (N−X−Y) rows of shift register regions;
    the second portion of the first branch transmission section passes through the X rows of shift register regions; the first portion of the second branch transmission section passes through the X rows of shift register regions, and the second portion of the second branch transmission section passes through the Y rows of shift register regions; and
    the first portion of the third branch transmission section passes through (X+Y) rows of shift register regions, and the second portion of the third branch transmission section passes through (N−X−Y) rows of shift register regions, and X, Y, and N satisfy that:

$$X \cdot C1 = Y \cdot C1 + X \cdot C2; \text{ and}$$

$$X \cdot C1 = (N-X-Y) \cdot C1 + (X+Y) \cdot C2;$$

wherein X, Y, and N are all positive integers, and X and Y are both less than N;
    C1 is a resistance-capacitance delay generated on a branch transmission section when the branch transmission section passes through a row of pixel region and a row of shift register region and is connected to a shift register; and C2 is a resistance-capacitance delay generated on the branch transmission section when the branch transmission section passes through the row of pixel region and the row of shift register region.

14. The array substrate according to claim 1, wherein the at least two groups of shift registers include a first group of shift registers, a second group of shift registers, a third group of shift registers, and a fourth group of shift registers that are sequentially away from the main body transmission section; and the clock signal line includes a first branch transmission section, a second branch transmission section, a third branch transmission section, and a fourth branch transmission section;

the first branch transmission section includes at least a second portion extending along a column direction in which the first group of shift registers are arranged, and each shift register in the first group of shift registers is connected in parallel to the second portion of the first branch transmission section;

the second branch transmission section includes a first portion and a second portion that are connected to each other, the first portion of the second branch transmission section is further connected to the main body transmission section, the second portion of the second branch transmission section extends along the column direction in which the second group of shift registers are arranged, and each shift register in the second group of shift registers is connected in parallel to the second portion of the second branch transmission section;

the third branch transmission section includes a first portion and a second portion that are connected to each other, the first portion of the third branch transmission section is further connected to the main body transmission section, the second portion of the third branch transmission section extends along the column direction in which the third group of shift registers are arranged, and each shift register in the third group of shift registers is connected in parallel to the second portion of the third branch transmission section; and the fourth branch transmission section includes a first portion and a second portion that are connected to each other, the first portion of the fourth branch transmission section is further connected to the main body transmission section, the second portion of the fourth branch transmission section extends along the column direction in which the fourth group of shift registers are arranged, and each shift register in the fourth group of shift registers is connected in parallel to the second portion of the fourth branch transmission section.

15. The array substrate according to claim 14, wherein orthographic projections of the plurality of shift registers on the substrate are located in N rows of shift register regions, orthographic projections of the first group of shift registers on the substrate are located in X rows of shift register regions, orthographic projections of the second group of shift registers on the substrate are located in Y rows of shift register regions, orthographic projections of the third group of shift registers on the substrate are located in Z rows of shift register regions, and orthographic projections of the fourth group of shift registers on the substrate are located in (N−X−Y−Z) rows of shift register regions; and the second portion of the first branch transmission section passes through the X rows of shift register regions;

the first portion of the second branch transmission section passes through the X rows of shift register regions, and the second portion of the second branch transmission section passes through the Y rows of shift register regions;

the first portion of the third branch transmission section passes through (X+Y) rows of shift register regions, and the second portion of the third branch transmission section passes through the Z rows of shift register regions;

the first portion of the fourth branch transmission section passes through (X+Y+Z) rows of shift register regions, and the second portion of the fourth branch transmission section passes through the (N−X−Y−Z) rows of shift register regions; and X, Y, Z, and N satisfy that:

$$X \cdot C1 = Y \cdot C1 + X \cdot C2;$$

$$X \cdot C1 = Z \cdot C1 + (X+Y) \cdot C2; \text{ and}$$

$$X \cdot C1 = (N-X-Y-Z) \cdot C1 + (X+Y+Z) \cdot C2;$$

wherein X, Y, Z, and N are all positive integers, and X, Y, and Z are all less than N;

C1 is a resistance-capacitance delay generated on a branch transmission section when the branch transmission section passes through a row of pixel region and a row of shift register region and is connected to a shift register; and C2 is a resistance-capacitance delay generated on the branch transmission section when the branch transmission section passes through the row of pixel region and the row of shift register region.

16. The array substrate according to claim 10, wherein the first branch transmission section further includes a first portion, and the first portion of the first branch transmission section is connected to the second portion of the first branch transmission section and the main body transmission section;

a first portion of each branch transmission section includes a horizontal portion extending along a row direction; and lengths of horizontal portions of the branch transmission sections are substantially equal.

17. A display panel, comprising the array substrate according to claim 1.

18. A display device, comprising the display panel according to claim 17.

19. A manufacturing method of an array substrate, comprising:

providing a substrate, the substrate having a display area and a non-display area located on at least one side of the display area; and forming at least one gate driving circuit and at least one clock signal line on a same side of the substrate, wherein a gate driving circuit includes a plurality of shift registers that are cascaded, the plurality of shift registers are respectively located in different rows, the plurality of shift registers are divided into at least two groups of shift registers, each group of shift registers includes at least one shift register located in a same column; and a gate driving circuit in the at least one gate driving circuit corresponds to at least one clock signal line; the clock signal line includes a main body transmission section and at least two branch transmission sections connected to the main body transmission section;

an orthographic projection of the main body transmission section on the substrate is located in the non-display area, and the main body transmission section is configured to transmit a clock signal; and orthographic projections of the at least two branch transmission sections on the substrate are located in the display area, and each branch transmission section is connected to a clock signal input terminal of each shift register in a group of shift registers.

\* \* \* \* \*